United States Patent
Uchiyama et al.

(10) Patent No.: US 9,887,340 B2
(45) Date of Patent: Feb. 6, 2018

(54) THERMOELECTRIC CONVERSION MODULE

(71) Applicant: ATSUMITEC CO., LTD., Shizuoka (JP)

(72) Inventors: Naoki Uchiyama, Shizuoka (JP); Kazuya Kubo, Shizuoka (JP)

(73) Assignee: Atsumitec Co., Ltd., Shizuoka (JP)

( * ) Notice: Subject to any disclaimer, the term of this patent is extended or adjusted under 35 U.S.C. 154(b) by 0 days.

(21) Appl. No.: 15/111,168

(22) PCT Filed: Jan. 21, 2015

(86) PCT No.: PCT/JP2015/051564
§ 371 (c)(1),
(2) Date: Jul. 12, 2016

(87) PCT Pub. No.: WO2015/111629
PCT Pub. Date: Jul. 30, 2015

(65) Prior Publication Data
US 2016/0329479 A1  Nov. 10, 2016

(30) Foreign Application Priority Data
Jan. 22, 2014 (JP) .................. 2014-009464

(51) Int. Cl.
*H01L 35/32* (2006.01)
*H01L 35/34* (2006.01)

(52) U.S. Cl.
CPC ............ *H01L 35/32* (2013.01); *H01L 35/325* (2013.01); *H01L 35/34* (2013.01)

(58) Field of Classification Search
CPC ........ H01L 35/32; H01L 35/34; H01L 35/325

USPC ........................................... 136/200
See application file for complete search history.

(56) References Cited

U.S. PATENT DOCUMENTS

| 5,168,339 | A | * | 12/1992 | Yokotani | ........... H01L 35/12 136/203 |
| 2007/0144573 | A1 | | 6/2007 | Mihara | |
| 2010/0116308 | A1 | * | 5/2010 | Hayashi | ........... H01L 35/32 136/236.1 |

(Continued)

FOREIGN PATENT DOCUMENTS

| JP | 09-008363 A | 1/1997 |
| JP | 2007294689 A | 11/2007 |

(Continued)

OTHER PUBLICATIONS

International Search Report (including English translation) and Written Opinion dated Mar. 17, 2015, for corresponding PCT Application No. PCT/JP2015/051564.

(Continued)

*Primary Examiner* — Tae-Sik Kang
(74) *Attorney, Agent, or Firm* — Kinney & Lange, P.A.

(57) ABSTRACT

The thermoelectric conversion module includes a porous insulating film having an insulation property and a thermoelectric conversion element in a thin film shape formed on a first surface of the insulating film, the first surface includes a surface inclined to a second surface positioned on an opposite side of the first surface, and a density of the insulating film increases as a distance between the first surface and the second surface decreases.

6 Claims, 4 Drawing Sheets

(56) References Cited

U.S. PATENT DOCUMENTS

2013/0081663 A1* 4/2013 Yang ...................... H01L 35/32
136/203

FOREIGN PATENT DOCUMENTS

| JP | 2012-114290 A | 6/2012 |
| JP | 2013-115359 A | 6/2013 |

OTHER PUBLICATIONS

Supplementary European Search Report dated Jul. 18, 2017, for corresponding European Application No. 15740100.

* cited by examiner

THERMOELECTRIC CONVERSION MODULE

TECHNICAL FIELD

The present invention relates to a thermoelectric conversion module that thermoelectrically generates heat by a Seebeck effect.

BACKGROUND ART

A thermoelectric conversion module is a module including a thermoelectric conversion element capable of converting thermal energy to electric energy by the Seebeck effect. By utilizing such an energy conversion property, waste heat discharged from industrial/consumer processes and moving bodies can be converted to effective power so that the thermoelectric conversion module and the thermoelectric conversion element configuring the thermoelectric conversion module are drawing attention as an energy saving technology in consideration of an environmental problem.

Such a thermoelectric conversion module is configured generally by joining a plurality of thermoelectric conversion elements (p-type semiconductors and n-type semiconductors) by electrodes. Such a thermoelectric conversion module is disclosed in Patent Document 1, for example. The thermoelectric conversion module disclosed in Patent Document 1 includes a pair of substrates, a plurality of thermoelectric conversion elements whose first ends are electrically connected with first electrodes arranged on one of the substrates and second ends are electrically connected to second electrodes arranged on the other substrate, and connection parts that electrically connect the first electrode electrically connected to the thermoelectric conversion element to the second electrode electrically connected to an adjacent thermoelectric conversion element.

PRIOR ART DOCUMENT

Patent Document

Patent Document 1: Japanese Patent Laid-Open No. 2013-115359

SUMMARY OF THE INVENTION

Problems to be Solved by the Invention

However, while further performance improvement, miniaturization and improvement of a degree of freedom of an installation location for a thermoelectric conversion module have been demanded as uses of the thermoelectric conversion module expand and various kinds of devices to be used are miniaturized in recent years, it is difficult to sufficiently cope with these demands by the thermoelectric conversion module of a conventional structure.

The present invention is implemented in consideration of such a problem, and an object of the present invention is to provide a thermoelectric conversion module for which miniaturization and improvement of a degree of freedom of an installation location can be achieved while improving a performance.

Means for Solving the Problems

In order to achieve the above-described object, a thermoelectric conversion module of the present invention includes a porous insulating film having an insulation property and a thermoelectric conversion element in a thin film shape formed on a first surface of the insulating film, the first surface includes a surface inclined to a second surface positioned on an opposite side of the first surface, and a density of the insulating film increases as a distance between the first surface and the second surface decreases.

Advantageous Effects of the Invention

According to the thermoelectric conversion module relating to the present invention, miniaturization and improvement of a degree of freedom of an installation location can be achieved while improving a performance.

MODE FOR CARRYING OUT THE INVENTION

Hereinafter, with reference to the drawings, a mode for carrying out the thermoelectric conversion module by the present invention will be described in detail based on an embodiment and modifications. Note that the present invention is not limited to contents described below, and can be modified and implemented in a range of not changing the gist. In addition, drawings used when describing the embodiment and the modifications all schematically illustrate the thermoelectric conversion module by the present invention or configuration members thereof, are partially emphasized, enlarged, reduced or omitted or the like in order to deepen understandings, and sometimes do not accurately indicate scales and shapes or the like of the individual configuration members. Further, various numerical values used in the embodiment and the modifications all indicate examples and can be variously changed as needed.

Embodiment (Manufacturing Method of Thermoelectric Conversion Module)

Hereinafter, while referring to FIG. 1 and FIG. 4, the manufacturing method of a thermoelectric conversion module relating to the present embodiment will be described. Here, FIGS. 1 to 4 are sectional views in a manufacturing process of the thermoelectric conversion module relating to the present embodiment.

Figure 1:
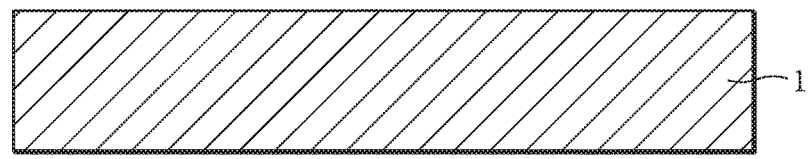
FIG. 1 is a sectional view in a manufacturing process of a thermoelectric conversion module relating to an embodiment.

First, as illustrated in FIG. 1, an insulating film 1 which is a flat film member (foam body) having an insulation property and a porous property is prepared. For the insulating film 1, for example, a polymer-based film of polyester, polystyrene, polycarbonate, aramid, polyimide, or polyurethane or the like, or a film formed of ceramic can be used. A film thickness of the insulating film 1 can be appropriately selected from, for example, about 20 µm, about 50 µm, about 180 µm, or larger.

Figure 2:
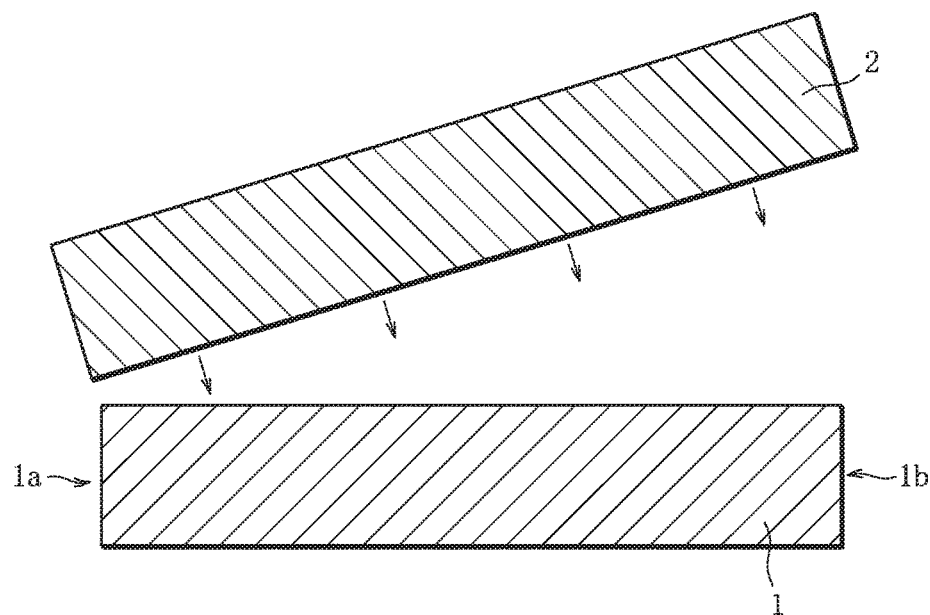
FIG. 2 is a sectional view in the manufacturing process of the thermoelectric conversion module relating to the embodiment.

Next, as illustrated in FIG. 2, a roller 2 in a columnar shape is rotationally moved while being pressed to the insulating film 1, and the entire insulating film 1 is compressed. More specifically, the roller 2 is inclined and pressed to a surface of the insulating film 1, and a compression amount is gradually reduced from a first end 1a to a second end 2b of the insulating film 1.

Figure 3:
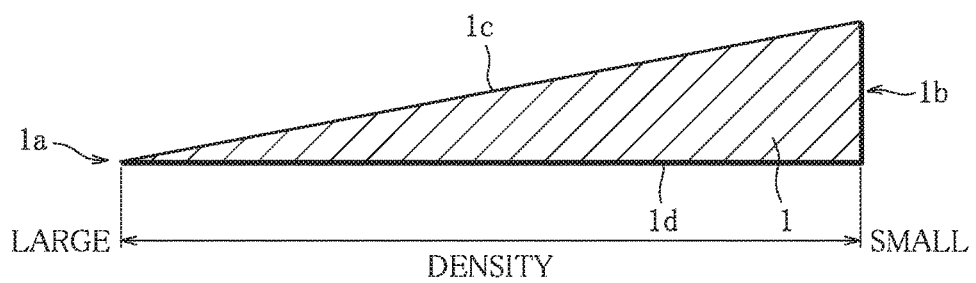
FIG. 3 is a sectional view in the manufacturing process of the thermoelectric conversion module relating to the embodiment.
Figure 4:
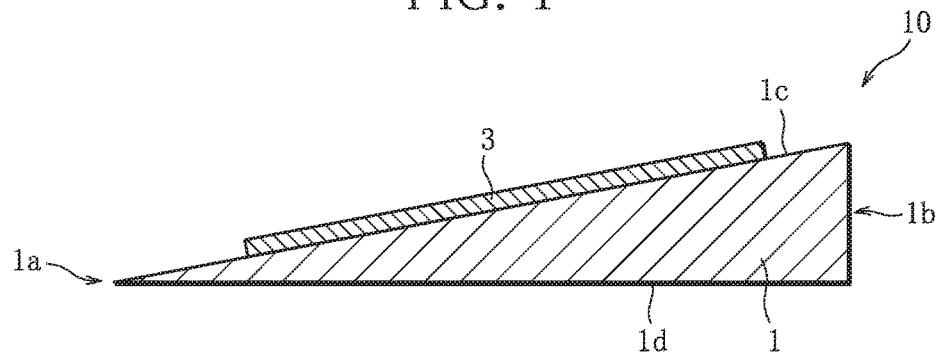
FIG. 4 is a sectional view in the manufacturing process of the thermoelectric conversion module relating to the embodiment.

Through such a compression process, as illustrated in FIG. 3, a cross section of the insulating film 1 becomes a triangular shape. That is, a first surface 1c of the insulating film 1 is inclined at a fixed angle to a second surface 1d positioned on an opposite side of the first surface 1c. In other words, in the insulating film 1 after compression, a distance between the first surface 1c and the second surface 1d becomes gradually long from the first end 1a to the second end 1b. Here, since a density increases as a compression amount increases, the density increases as the distance between the first surface 1c and the second surface 1d decreases. That is, the density increases from the second end 1b to the first end 1a.

Next, as illustrated in FIG. 4, using a general plating technology or vacuum deposition technology, a thermoelectric conversion element 3 in a thin film shape is formed on the first surface of the insulating film 1. Though not shown in FIG. 4, in the thermoelectric conversion element 3, a plurality of P-type semiconductors (thermoelectric conversion materials) and a plurality of N-type semiconductors (thermoelectric conversion materials) are alternately arranged side by side. Also, first ends of the P-type semiconductors and the N-type semiconductors are positioned on a side of the first end 1a of the insulating film 1, and second ends are positioned on a side of the second end 1b of the insulating film 1. Further, ends of the P-type semiconductors and the N-type semiconductors are electrically connected by electrodes (not shown in the figure) so that the P-type semiconductors and the N-type semiconductors are connected in series or parallel.

Through the above-described processes, formation of a thermoelectric conversion module 10 is completed.

(Using Form and Effect of Thermoelectric Conversion Module)

Next, while referring to FIG. 5, a using form of the thermoelectric conversion module 10 relating to the present embodiment will be described. Here, FIG. 5 is a sectional view illustrating a using state of the thermoelectric conversion module 10 relating to the present embodiment.

Figure 5:
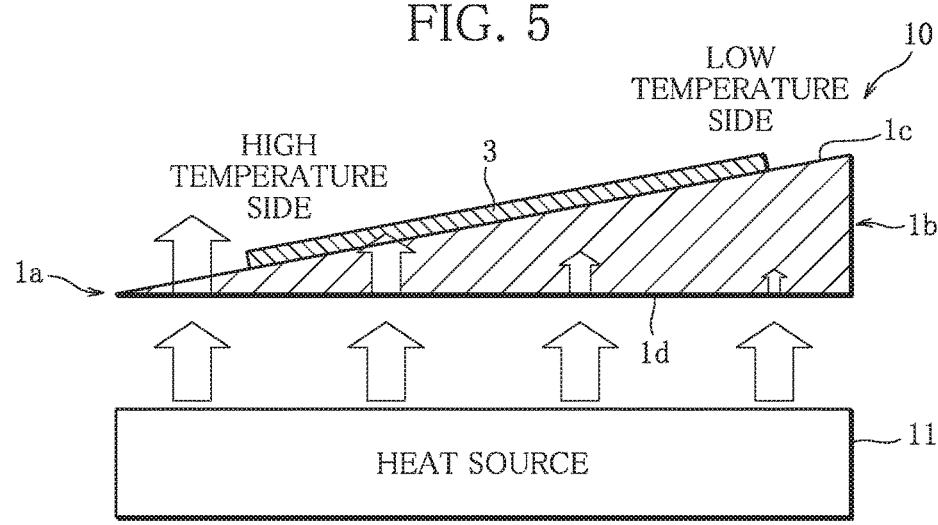
FIG. 5 is a sectional view illustrating a using state of the thermoelectric conversion module relating to the embodiment.

As illustrated in FIG. 5, the thermoelectric conversion module 10 is arranged so that the second surface 1d gets close to a heat source 11. That is, the thermoelectric conversion module 10 is supplied with heat from the side of the second surface 1d. Here, for the insulating film 1 of the thermoelectric conversion module 10, the density is different according to the thickness, and a thermal conductivity increases as the density increases. That is, in the insulating film 1, the thermal conductivity becomes gradually low from the first end 1a to the second end 1b. Thus, heat of the heat source 11 easily reaches the thermoelectric conversion element 3 on the side of the first end 1a, and the heat of the heat source 11 does not easily reach the thermoelectric conversion element 3 on the side of the second end 1b. Thus, in the thermoelectric conversion element 3, one end positioned on the side of the first end 1a of the insulating film 1 becomes a high temperature, the other end positioned on the side of the second end 1b of the insulating film 1 becomes a low temperature, and electromotive force by the temperature difference is generated.

As described above, since the temperature difference in the thermoelectric conversion element 3 of the thermoelectric conversion module 10 relating to the present embodiment is generated due to a structure of the insulating film 1, the temperature difference in the thermoelectric conversion element 3 does not easily vary, and stable thermoelectric power generation can be performed. That is, a performance of the thermoelectric conversion module 10 can be improved, and high reliability can be achieved.

In addition, since the thermoelectric conversion element 3 is formed on the insulating film 1 which is an insulator, at a part to be insulated of the thermoelectric conversion module 10, an excellent insulation characteristic can be secured. Further, not an end but a main surface of the thermoelectric conversion element 3 is in contact with the first surface 1c of the insulating film 1, a joined area of the thermoelectric conversion element 3 and the insulating film 1 becomes large, an excellent joining characteristic of the thermoelectric conversion element 3 and the insulating film 1 can be secured, and joining strength of the thermoelectric conversion module 10 itself can be improved. In other words, in the thermoelectric conversion module 10, even when dimensions of the N-type semiconductors and the P-type semiconductors configuring the thermoelectric conversion element 3 vary, a joining defect of the thermoelectric conversion element 3 and the insulating film 1 does not occur, and the reliability of the thermoelectric conversion module 10 can be improved.

Then, since the thermoelectric conversion module 10 relating to the present embodiment has a relatively simple structure that the thermoelectric conversion element 3 is formed on the insulating film 1, a manufacturing cost and manufacturing time can be easily reduced. In particular, since the thermoelectric conversion module 10 relating to the present embodiment is flexible since it is formed in a film shape, and can be easily installed at various locations since it is miniaturized.

As above, for the thermoelectric conversion module 10 relating to the present embodiment, miniaturization and improvement of a degree of freedom of an installation location can be achieved while improving a performance.

Modifications

In the embodiment described above, a configuration of installing the heat source 11 on the side of the second surface 1d positioned on the opposite side of a formation surface of the thermoelectric conversion element 3 is assumed, however, the heat source 11 may be installed on the side of the first surface 1c. In such a case, a cooling device may be arranged on the side of the second surface 1d and a part where the distance between the first surface 1c and the second surface 1d is short may be efficiently cooled compared to the part where it is long so that the temperature rises from the first end 1a to the second end 1b.

Figure 6:
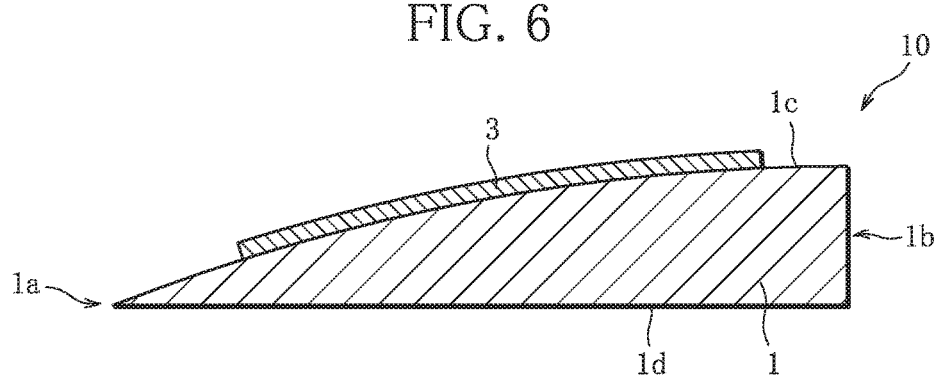
FIG. 6 is a sectional view of a thermoelectric conversion module relating to a modification.
Figure 7:
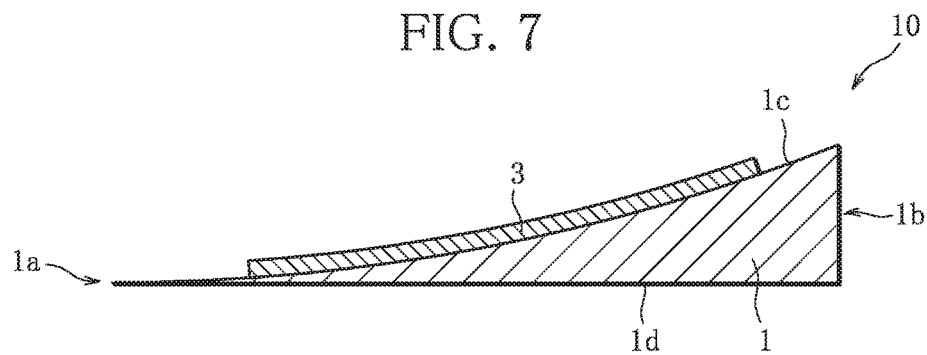
FIG. 7 is a sectional view of the thermoelectric conversion module relating to the modification.

In addition, in the embodiment described above, the flat film member is compressed so that the cross section of the insulating film 1 becomes a triangle, however, the shape after the compression is not limited to the triangle. For example, as illustrated in FIG. 6 and FIG. 7, the first surface of the insulating film 1 may be curved. More specifically, the first surface 1c may be curved so as to be projected toward an outer side as illustrated in FIG. 6, or the first surface 1c may be curved so as to be projected toward an inner side as illustrated in FIG. 7. In both cases, since the thermoelectric conversion element 3 is formed into the thin film shape, it is formed along the shape of the first surface 1c.

Figure 8:
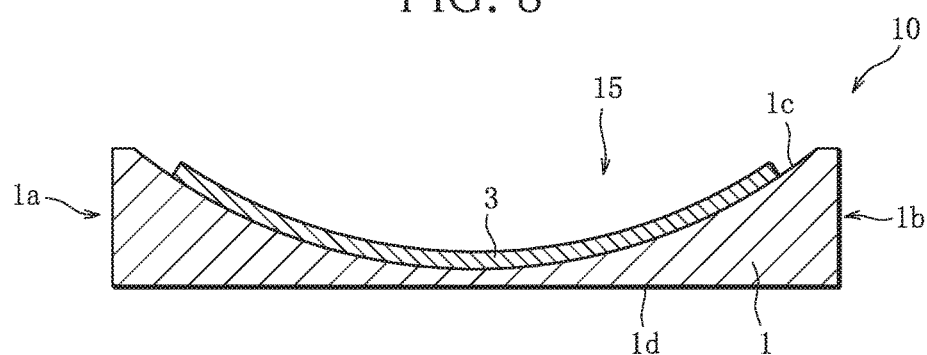
FIG. 8 is a sectional view of the thermoelectric conversion module relating to the modification.
Figure 9:
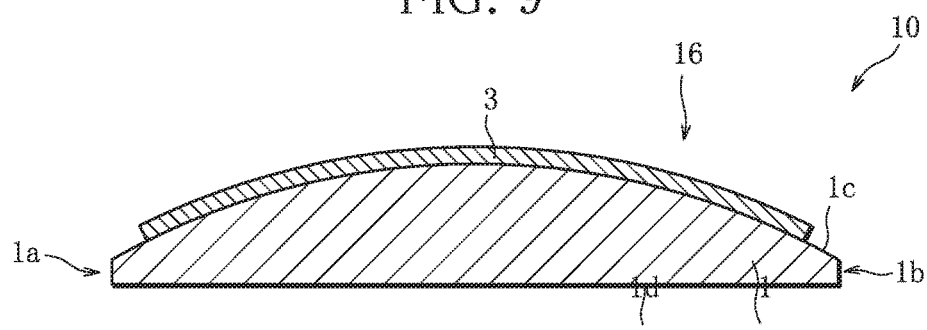
FIG. 9 is a sectional view of the thermoelectric conversion module relating to the modification.

Also, the flat film member may be compressed so that the insulating film 1 has a gutter-like recess 15 on the side of the first surface 1c as illustrated in FIG. 8, or the flat film member may be compressed so that the insulating film 1 has a projection 16 on the side of the first surface 1c as illustrated in FIG. 9. In the thermoelectric conversion module 10 as illustrated in FIG. 8 or FIG. 9, the N-type semiconductors and the P-type semiconductors need to be connected in series while being juxtaposed so that, while the part where the distance between the first surface 1c and the second surface 1d is the shortest is turned to a high temperature side, the part where the distance is the longest is turned to a low temperature side. Note that, while the part where the distance between the first surface 1c and the second surface 1d is the longest is turned to the high temperature side, the part where the distance is the shortest may be turned to the low temperature side.

In any case of the modifications illustrated in FIG. 6 to FIG. 9, effects similar to that of the thermoelectric conversion module 10 relating to the embodiment described above can be demonstrated. In addition, the shape of the insulating film 1 is changed according to a state of an installation location of the thermoelectric conversion module 10 so that the thermoelectric conversion module 10 in a shape optimum for the installation location can be provided.

Figure 10:
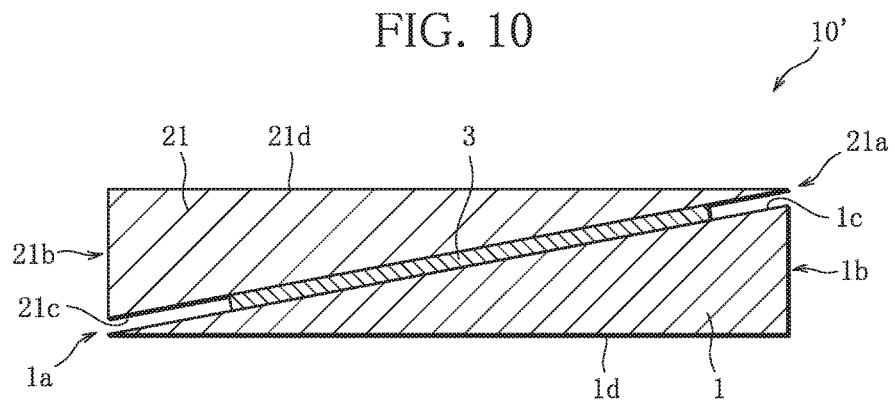
FIG. 10 is a sectional view of the thermoelectric conversion module relating to the modification.

Further, while the insulating film 1 is disposed only on one side of the thermoelectric conversion element 3 in the above-described embodiment 1, however, as illustrated in FIG. 10, the thermoelectric conversion element 3 may be held by two insulating films 1 and 21. Specifically, as illustrated in FIG. 10, the thermoelectric conversion element 3 is positioned between the first surfaces 1c and 21c of the two insulating films 1 and 21. Here, the insulating film 21 has the same structure and characteristic as the insulating film 1.

In a thermoelectric conversion module 10' having such a structure, compared to the thermoelectric conversion module 10 relating to the embodiment 1 described above, a further excellent insulation characteristic can be secured. In addition, when the heat source 11 is brought close to the side of the second surface 1d of the insulating film 1 of the thermoelectric conversion module 10', similarly to the embodiment described above, the first end 1a becomes the high temperature side, and the second end 1b becomes the low temperature side. Here, since a second end 21b (an end where a distance between the first surface 21c and a second surface 21d is long) of the insulating film 21 is arranged so as to face the first end 1a, the heat transmitted to the thermoelectric conversion element 3 is not easily transmitted to the second surface 21d. Therefore, at one end of the thermoelectric conversion element 3 positioned between the first end 1a and the second end 21b, a high temperature state can be excellently maintained. On the other hand, since a first end 21a (an end where the distance between the first surface 21c and a second surface 21d is short) of the insulating film 21 is arranged so as to face the second end 1b, the heat transmitted to the thermoelectric conversion element 3 is easily transmitted to the second surface 21d. Therefore, at the other end of the thermoelectric conversion element 3 positioned between the second end 1b and the first end 21a, a low temperature state can be excellently maintained. That is, in the thermoelectric conversion module 10' relating to the present modification, since the temperature difference between both ends of the thermoelectric conversion element 3 can be easily increased and the temperature difference can be excellently kept, more excellent thermoelectric conversion efficiency can be provided.

Note that a cooling device such as a heatsink may be arranged on the second surface 21d, thus the temperature difference between both ends of the thermoelectric conversion element 3 can be more increased, the temperature difference can be excellently kept, and the thermoelectric conversion efficiency of the thermoelectric conversion module 10' can be further improved.

Implementations of the Present Invention

The thermoelectric conversion module relating to a first implementation of the present invention includes a porous insulating film having an insulation property and a thermoelectric conversion element in a thin film shape formed on a first surface of the insulating film, the first surface includes a surface inclined to a second surface positioned on an opposite side of the first surface, and a density of the insulating film increases as a distance between the first surface and the second surface decreases.

For the thermoelectric conversion module relating to a second implementation of the present invention, in the thermoelectric conversion module relating to the first implementation, the insulating film is formed by compressing a flat film member.

For the thermoelectric conversion module relating to a third implementation of the present invention, in the thermoelectric conversion module relating to the first or second implementation, the first surface is inclined at a fixed angle to the second surface.

For the thermoelectric conversion module relating to a fourth implementation of the present invention, in the thermoelectric conversion module relating to the first or second implementation, the first surface is curved.

For the thermoelectric conversion module relating to a fifth implementation of the present invention, in the thermoelectric conversion module relating to the first or second implementation, the insulating film includes a gutter-like recess on a side of the first surface.

For the thermoelectric conversion module relating to a sixth implementation of the present invention, in the thermoelectric conversion module relating to the first or second implementation, the thermoelectric conversion element is held by two of the insulating films having the same shape.

EXPLANATION OF REFERENCE SIGNS 1, 21 Insulating film
1a, 21a First end
1b, 21b Second end
1c, 21c First surface
1d, 21d Second surface
2 Roller
3 Thermoelectric conversion element 10, 10' Thermoelectric conversion module
11 Heat source
15 Recess
16 Projection

The invention claimed is:

1. A thermoelectric conversion module comprising:
a porous insulating film having an insulation property; and
a thermoelectric conversion element in a thin film formed on a first surface of the insulating film,
wherein the first surface includes a surface inclined to a second surface positioned on an opposite side of the first surface, and
wherein a density of the insulating film increases as a distance between the first surface and the second surface decreases.

2. The thermoelectric conversion module according to claim 1,
wherein the insulating film is formed by compressing a flat film member.

3. The thermoelectric conversion module according to claim 1,
wherein the first surface is inclined at a fixed angle to the second surface.

4. The thermoelectric conversion module according to claim 1,
wherein the first surface is curved.

5. The thermoelectric conversion module according to claim 1,
wherein the insulating film includes a gutter-like recess on a side of the first surface.

6. A thermoelectric conversion module comprising:
a first porous insulating film having an insulation property;
a second porous insulating film having an insulation property, the first and second insulating films having a same shape; and
a thermoelectric conversion element in a thin film formed on a first surface of the first insulating film,
wherein the first surface includes a surface inclined to a second surface positioned on an opposite side of the first surface, and
wherein a density of the first insulating film increases as a distance between the first surface and the second surface decreases; and
wherein the thermoelectric conversion element is held by the first and second insulating films.

* * * * *